United States Patent
Kloiber et al.

(10) Patent No.: US 10,319,493 B2
(45) Date of Patent: Jun. 11, 2019

(54) APPARATUS AND METHOD FOR ESTABLISHING AN ELECTRICALLY CONDUCTIVE AND MECHANICAL CONNECTION

(71) Applicant: EPCOS AG, Munich (DE)

(72) Inventors: Gerald Kloiber, Feldkirchen (AT); Heinz Strallhofer, Deutschlandsberg (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/784,809

(22) PCT Filed: Mar. 24, 2014

(86) PCT No.: PCT/EP2014/055829
§ 371 (c)(1),
(2) Date: Oct. 15, 2015

(87) PCT Pub. No.: WO2014/173595
PCT Pub. Date: Oct. 30, 2014

(65) Prior Publication Data
US 2016/0055935 A1    Feb. 25, 2016

(30) Foreign Application Priority Data

Apr. 25, 2013 (DE) .......... 10 2013 104 207

(51) Int. Cl.
H01B 5/02 (2006.01)
B23K 20/02 (2006.01)
(Continued)

(52) U.S. Cl.
CPC ............. H01B 5/02 (2013.01); B23K 20/023 (2013.01); H01B 1/02 (2013.01); H01C 1/144 (2013.01);
(Continued)

(58) Field of Classification Search
USPC .......................................... 29/840
See application file for complete search history.

(56) References Cited

U.S. PATENT DOCUMENTS 4,171,477 A * 10/1979 Funari ............... B23K 20/005
                                                      219/113
4,286,249 A    8/1981 Lewis et al.
(Continued)

FOREIGN PATENT DOCUMENTS

DE    102006050291 A1    5/2007
DE    102006003930 A1    8/2007
(Continued)

OTHER PUBLICATIONS

"Eutektisches Bonden & Thermokompressionsbonden (Eutectic Bonding)," Fraunhofer-Institut für Elektronische Nanosysteme (Fraunhofer Institute for Electronic Nano Systems), http://www.enas.fraunhofer.de/en/departments/SP/forschungsschwerpunkte/Waferbonden/eutektisches_bondenthermokompres-sionsbonden.html, retrieval date: Feb. 18, 2014, 2 pages.

*Primary Examiner* — Dimary S Lopez Cruz
(74) *Attorney, Agent, or Firm* — Slater Matsil, LLP

(57) ABSTRACT

An apparatus includes a main body having an electrode and a contact element. The contact element is directly mechanically and electrically conductively connected to the electrode in order to form an electrical connection between the main body and the contact element. The electrical and mechanical connection between the electrode and the contact element is free of melting regions of the materials of the electrode and of the contact element that are involved in the connection. Furthermore, the connection is realized in a manner free of connection material, for example, in a manner free of solder material.

15 Claims, 1 Drawing Sheet

(51) Int. Cl.
   *H01B 1/02*   (2006.01)
   *H01C 1/14*   (2006.01)
   *H01C 1/144*  (2006.01)
   *H01C 17/28*  (2006.01)
   *H01L 23/00*  (2006.01)
   *H01C 7/04*   (2006.01)

(52) U.S. Cl.
   CPC ......... *H01C 1/1413* (2013.01); *H01C 17/283* (2013.01); *H01L 24/85* (2013.01); *H01C 7/04* (2013.01); *H01L 24/05* (2013.01); *H01L 24/45* (2013.01); *H01L 2224/04042* (2013.01); *H01L 2224/05552* (2013.01); *H01L 2224/05644* (2013.01); *H01L 2224/45144* (2013.01); *H01L 2224/45155* (2013.01); *H01L 2224/85203* (2013.01)

(56) References Cited

U.S. PATENT DOCUMENTS

| | | | |
|---|---|---|---|
| 4,821,944 A * | 4/1989 | Tsumura | B23K 13/01 219/56.21 |
| 5,045,151 A * | 9/1991 | Edell | H01L 23/293 252/79.3 |
| 5,559,054 A * | 9/1996 | Adamjee | H01L 24/11 228/179.1 |
| 5,739,587 A * | 4/1998 | Sato | H01L 24/03 257/758 |
| 5,948,286 A * | 9/1999 | Chalco | B23K 26/06 219/121.63 |
| 6,181,016 B1 * | 1/2001 | Lin | H01L 24/05 257/758 |
| 6,287,950 B1 * | 9/2001 | Wu | H01L 24/03 257/E21.508 |
| 6,740,985 B1 * | 5/2004 | Zhao | H01L 24/03 257/758 |
| 6,891,034 B2 | 5/2005 | Dannhorn et al. | |
| 7,443,014 B2 | 10/2008 | Otremba | |
| 7,560,809 B2 * | 7/2009 | Nakajima | H01L 24/41 257/692 |
| 7,692,293 B2 | 4/2010 | Apfelbacher et al. | |
| 7,851,913 B2 * | 12/2010 | Gutt | H01L 24/03 257/750 |
| 7,851,927 B2 | 12/2010 | Hosseini et al. | |
| 8,633,426 B2 | 1/2014 | Macher et al. | |
| 9,379,085 B2 * | 6/2016 | Tsubaki | B23K 20/005 |
| 2005/0073058 A1 * | 4/2005 | Kuo | H01L 24/05 257/786 |
| 2007/0141755 A1 * | 6/2007 | Luechinger | H01L 23/4952 438/123 |
| 2007/0197017 A1 * | 8/2007 | Fujimoto | H01L 23/49562 438/617 |
| 2010/0123995 A1 | 5/2010 | Otsuka et al. | |
| 2011/0085929 A1 | 4/2011 | Gupta | |
| 2011/0170272 A1 * | 7/2011 | Kloiber | G01K 1/026 361/760 |
| 2011/0192885 A1 * | 8/2011 | Hochstenbach | H01L 24/05 228/164 |
| 2011/0266666 A1 | 11/2011 | Maeda et al. | |
| 2013/0313604 A1 | 11/2013 | Engl et al. | |
| 2014/0227551 A1 | 8/2014 | Rateiczak et al. | |

FOREIGN PATENT DOCUMENTS

| | | | | |
|---|---|---|---|---|
| DE | 102006060484 A1 | 6/2008 | | |
| DE | 102011016935 A1 | 10/2012 | | |
| EP | 2278851 A1 | 1/2011 | | |
| JP | 06084683 A | 3/1994 | | |
| JP | 6268027 A | 9/1994 | | |
| JP | 2010123614 A | 6/2010 | | |
| JP | 05283294 B2 | 9/2013 | | |
| JP | 5283294 B2 | 9/2013 | | |
| JP | 5689202 B1 | 3/2015 | | |
| JP | 6084683 B2 | 2/2017 | | |
| WO | 2006063539 A1 | 6/2006 | | |
| WO | WO-2012155345 A1 * | 11/2012 | ............ | H01L 24/48 |
| WO | 2013020863 A1 | 2/2013 | | |

* cited by examiner

APPARATUS AND METHOD FOR ESTABLISHING AN ELECTRICALLY CONDUCTIVE AND MECHANICAL CONNECTION

This patent application is a national phase filing under section 371 of PCT/EP2014/055829, filed Mar. 24, 2014, which claims the priority of German patent application 10 2013 104 207.4, filed Apr. 25, 2013, each of which is incorporated herein by reference in its entirety.

TECHNICAL FIELD

The present invention relates to an apparatus comprising a main body and a contact element. The present invention furthermore relates to an electronic component.

SUMMARY

Embodiments of the invention specify measures which enable an improved, in particular electrically conductive and mechanical, connection between a main body having an electrode and a contact element.

An apparatus proposed comprises a main body having an electrode and a contact element, wherein the contact element is directly mechanically and electrically conductively connected to the electrode in order to electrically conductively and mechanically connect the main body and the contact element. The electrically conductive and mechanical connection is preferably formed without further or separate connection elements or connection means, apart from the main body having the electrodes and the contact element.

In one configuration, the material of the electrode comprises a noble metal, for example, gold. Furthermore, the electrode can consist of a noble metal, for example, gold. Furthermore, the electrode can comprise or consist of a seminoble metal.

In one configuration, the material of the contact element comprises a noble metal, for example, gold, or a seminoble metal.

In one configuration, the contact element consists of a noble metal, for example, gold, or of a seminoble metal.

In one configuration, the connection between the electrode and the contact element has a plurality of local connection regions delimited from one another. The direct mechanical and electrically conductive connection between the electrode and the contact element advantageously enables a technically particularly simple and/or cost-effective embodiment of the connection.

In one configuration, the connection has a multiplicity of local connection regions delimited from one another. The connection regions can be arranged in a connecting region of the apparatus. The connecting region can form a continuous region where the connection regions are arranged. The connection regions can be spatially separated from one another or arranged in such a way that the connection regions are not continuous. This configuration advantageously enables a technically particularly simple and/or cost-effective embodiment of the connection.

The connection region or connection regions of the connection preferably denote regions or areas of the apparatus in which the electrical and mechanical connection is formed.

In one configuration, the connection between the electrode and the contact element has a continuous connection region. This advantageously enables the formation of a particularly stable mechanical and/or low-resistance electrically conductive connection.

In the case of the configuration of the connection comprising a continuous connection region, the connecting region preferably coincides with the connection region.

In one preferred configuration, the connection is formed by a cohesive diffusion connection between the electrode material and the material of the contact element. This configuration advantageously enables a mechanical connection between the electrode and the contact element.

The diffusion connection is preferably formed by a material diffusion, particularly preferably by a solid diffusion of material of the electrode into the material of the contact element, or vice versa, such that the connection forms as a result of a cohesive connection between the electrode material and the material of the contact element.

In one preferred configuration, the connection is free of melting regions of the materials of the electrodes and of the contact element which are involved in the connection. As a result of this configuration, the connection can preferably be produced particularly simply, in particular during the production of the connection without melting of the electrode material and/or of the material of the contact element.

References to and/or melting points of the materials of the contact element and of the electrode relate in the present case only to the joining materials, i.e., the materials of the contact element and of the electrode which are involved in the connection or are offered for the latter. The contact element and the electrode can furthermore in each case comprise different materials than the joining materials.

In the case of electrical welding connections, the materials to be connected for producing a cohesive and electrically conductive connection are usually melted, locally high temperatures being required. This can lead to a very severe loading, for example, for the component contacted in this way, and to damage to the component. These disadvantages can be avoided by virtue of the connection presented, by virtue of the fact that the connection can be formed without the involvement of melting regions and/or high temperatures.

In one preferred configuration, the connection is realized in a manner free of connection material, for example, in a manner free of solder material. This makes it possible to form or produce the connection without any connection materials, for example, solder materials, a result of which the formation or production of the connection can be simplified, for example, compared with soldering connections or other connections which comprise a connection material.

One advantage of the connection presented relates to the fact that disadvantages which would be associated, for example, with a soldering connection between the contact element and the electrode do not occur in the case of the connection presented. Solder having a high melting point (having a melting point of above 300° C.) with a high lead content of more than 90% is often used in the case of electrical contacting arrangements. Furthermore, components having an electrical contacting with lead-free soldering on the basis of tin are also available. Disadvantages of these connections concern sensitivities toward migration of the solder materials mentioned. In a wet environment and/or when an electrical voltage is present, migration of metal ions from the solder and/or the electrode often occurs. Particularly silver, for example, from the electrode, and lead from the solder are particularly migratable.

In one preferred configuration, a surface of the contact element which faces the electrode has a noble metal surface region in a connecting region in which the connection is formed. This configuration advantageously enables a particularly simple production of the connection between the contact element and the electrode since the formation of undesirable oxide layers at the surface of the contact element can be prevented by the purity of the noble metals at a surface of the contact element. Such oxide layers can adversely influence the electrical properties of an electrical connection. Alternatively, a protective gas atmosphere that can likewise prevent the formation of harmful oxide layers can be dispensed with during the production of the electrical connection.

In one preferred configuration, the contact element is composed of nickel or comprises nickel.

In one preferred configuration, the contact element is coated with a noble metal in a connecting region.

In one preferred configuration, the contact element is partly coated with a noble metal in the connecting region. This configuration advantageously enables a particularly cost-effective production of the connection or of the apparatus.

The connecting region can have dimensions of a few millimeters, for example, 5 mm.

In one preferred configuration, the contact element is a wire. By virtue of this configuration, the main body can be mechanically or electrically connected to a further component particularly expediently via the contact element. In accordance with this configuration, the length of the contact element is preferably a few centimeters, for example, 5 cm.

In one configuration, the contact element is formed without a flattened portion.

In one configuration, the contact element has an insulation. The insulation is preferably arranged outside the connecting region. By virtue of this configuration, the contact element can advantageously be electrically insulated from external influences.

In one preferred configuration, the contact element is flattened, for example, in a tapelike manner, in the region in which the connection is formed. This advantageously makes it possible to form the largest possible connecting region of the contact element.

Furthermore, an electronic component is specified, comprising the apparatus. The electronic component can furthermore constitute the apparatus. Preferably, the electronic component is the apparatus.

In one preferred configuration of the electronic component, the main body contains a ceramic, for example, an NTC ceramic, or comprises a semiconductor body.

In one preferred configuration of the electronic component, the electronic component additionally comprises an encapsulation around the connection. The encapsulation is arranged and formed in such a way that it protects the connection against the action of external forces. The encapsulation preferably protects the connection against the action of external mechanical forces. The encapsulation can comprise, for example, a shaped body for mechanically stabilizing the connection.

Furthermore, a method for producing an electrically conductive and mechanical connection between a main body having an electrode and a contact element is specified. The connection described above is preferably producible or produced by means of the method described here. In particular, all features disclosed for the method can also relate to the above-described apparatus, the electronic component and/or the connection. The main body, the electrode and the contact element preferably relate to the components already mentioned above. The method comprises the steps of providing the main body having the electrode and providing the contact element. The method furthermore comprises directly mechanically contacting the electrode and the contact element in a contact region. The method furthermore comprises applying a mechanical force and heat to the contact region, such that the electrically conductive and mechanical connection between the electrode and the contact element is formed in the contact region. The contact region preferably relates to a mechanical connection between the electrode and the contact element.

The mechanical force is preferably less than a deformation force of the contact element. The deformation force furthermore preferably relates to a significant and/or plastic deformation of the contact element.

In one preferred configuration, the mechanical force and heat are applied to the contact region without further connection means, such that the connection between the electrode and the contact element is formed in the contact region.

Applying a mechanical force and heat to the contact region preferably relates to the application of a mechanical force of the contact region and a heat treatment. Preferably, applying heat or the application or treatment with heat relates to temperatures above a room temperature, ambient temperature or standard temperature.

In one configuration, the mechanical force is applied to the electrode in the contact region, such that the connection is formed between the electrode and the contact element. In one configuration, the mechanical force is applied to the contact element in the contact region, such that the connection is formed between the electrode and the contact element.

In one preferred configuration, exclusively the mechanical force and heat are applied to the contact region for the purpose of forming the connection. This configuration advantageously enables a particularly simple configuration of the connection only with mechanical force and with heat without further influences.

In one preferred configuration, the connecting region at least partly overlaps the contact region. Preferably, the connecting region and the contact region coincide over a large area.

In one preferred configuration, the temperature for the application of heat and the mechanical force are chosen in such a way that a diffusion of material takes place, whereby the contact element is mechanically stably connected to the electrode. In this case, electrode material can diffuse into the contact element or the material of the contact element. Additionally or alternatively, the material of the contact element can diffuse into the electrode material. The diffusion preferably concerns a solid diffusion, wherein no liquid phase of electrode material and no liquid phase of the material of the contact element are involved. In particular, no melting of the materials mentioned takes place during the production or formation of the connection.

In one preferred configuration, the temperature for the application of heat is below the melting point of the electrode material.

In one preferred configuration, the temperature for the application of heat is below the melting point of the material of the contact element that is offered for the connection. By virtue of this configuration, a particularly simple formation or production of the connection can furthermore be achieved since process-technologically complex melting of the electrode material and/or of the material of the contact element that is offered for the connection can be dispensed with during corresponding production of the connection.

In one preferred configuration, the mechanical force is between 5 newtons and 10 newtons.

In one preferred configuration, the application of heat is carried out at temperatures of between 350° C. and 550° C.

In one preferred configuration, the method comprises, after the direct mechanical connection, the encapsulation of the connection, for example, with a shaped body for mechanically stabilizing the contact element.

The connection preferably connects the contact element and the electrode mechanically stably in such a way that until the encapsulation of the connection there is an electrically conductive connection between the electrode and the contact element.

The encapsulation of the connection advantageously enables further processing of the apparatus and exposure of the connection to external mechanical forces that are greater than a holding or connection force of the connection.

The connection force can be dependent on the geometry and/or the surface area of the connection region or connection regions of the connection.

The connection force can assume values of between 0.1 N and 10 N, for example, a value of 1 N. The total area of the connection region or connection regions can assume values of between 0.1 mm$^2$ and 10 mm$^2$, for example, a value of 1 mm$^2$.

In one preferred configuration, the temperature for the heat treatment is below the lowest melting point of the electrode material and of the material of the contact element that is offered for the connection.

The lowest melting point can relate to a minimum of the melting points of the electrode material and of the material of the contact element that is offered for the electrical connection.

BRIEF DESCRIPTION OF THE DRAWINGS

Further advantages, advantageous configurations and expediencies of the invention will become apparent from the following description of the exemplary embodiments in association with the figures.

Elements that are identical, of identical type and act identically are provided with identical reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1:
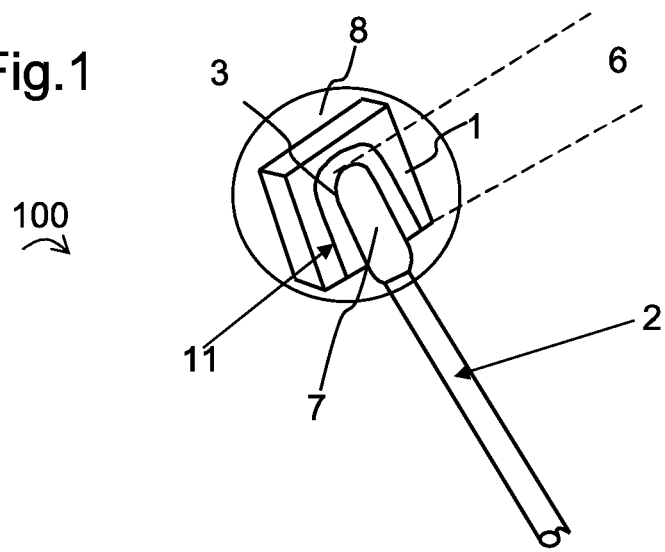
FIG. 1 shows a schematic view of an apparatus.

FIG. 1 shows an apparatus 100 comprising a main body 1. The main body 1 can be, for example, a sensor head, an, in particular sintered and pressed, NTC ceramic in the form of a plate, a semiconductor body or the main body of one of these elements. In this case, the semiconductor body can be round or angular. The apparatus can be part of an electronic component (not explicitly illustrated in the figures). Preferably, the electronic component is the apparatus.

The main body 1 has an electrode 11. The electrode 11 is preferably applied as an electrode layer on the main body 1. The apparatus 100 furthermore comprises a contact element 2, which is directly mechanically and electrically conductively connected to the electrode 11 in order to form a connection 3 between the main body 1 and the contact element 2.

The contact element 2 is preferably a wire. The contact element 2 furthermore has a flattened portion 7 at an end facing the main body 1. The flattened portion 7 can be embodied in a tapelike fashion. The flattened portion 7 preferably extends over a region in which the contact element 2 is electrically conductively connected to the electrode 11 or in which the connection 3 is formed.

Alternatively, the contact element can be configured without a flattened portion. The contact element can furthermore be provided with an insulation (not explicitly illustrated in the figures).

The insulation can be arranged in regions of the contact element in which the contact element has no flattened portion.

The contact element 2 is furthermore electrically conductively and mechanically directly connected to the electrode 11 in a connecting region 6. Preferably, the abovementioned flattened portion 7 is arranged in the connecting region 6. The insulation is expediently arranged outside the connecting region 6.

Preferably, a surface of the contact element 2 that faces the electrode 11 has a noble metal surface region in the connecting region 6. The contact element 2 can be coated with a noble metal in the connecting region 6. The contact element 2 can furthermore be coated with a seminoble metal in the connecting region 6.

Although this is not explicitly illustrated in the figures, the apparatus can comprise one or a plurality of further contact elements. In this case, the main body can have one or a plurality of further electrodes, each of which is electrically conductively and directly mechanically connected to one of the further contact elements in order to form further connections.

Preferably, the connection 3 is formed in the connecting region. The connection 3 is preferably formed by a cohesive diffusion connection between the electrode material of the electrode 11 and the material of the contact element 2. The connection 3 is preferably free of melting regions of the materials of the electrode 11 and of the contact element 2 which are involved in the connection 3. The connection 3 is likewise preferably realized in a manner free of connection materials, for example, free of solder materials. In FIG. 1, the contact element 2 is illustrated as a wire. Furthermore, FIG. 1 illustrates an encapsulation 8 which encapsulates and preferably mechanically stabilizes the main body 1 and a part of the contact element 2.

Figure 2:
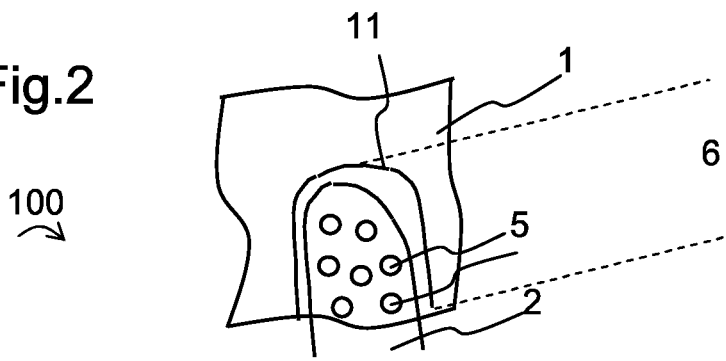
FIG. 2 shows a schematic plan view of the apparatus.

FIG. 2 shows, in addition to FIG. 1, local connection regions 5 delimited from one another, which preferably produce the connection between the electrode and the contact element. The local connection regions 5 preferably produce the direct mechanical and electrically conductive connection between the contact element and the electrode 11. In this case, the local connection regions 5 are produced by a cohesive diffusion connection of electrode material and the material of the contact element 2. The local connection regions 5 are furthermore spatially separated from one another or arranged spatially non-continuously.

In contrast to the illustration shown in FIG. 2, there can also exist just one continuous connection region that produces the direct mechanical and electrically conductive connection between the contact element and the electrode.

Figure 3:
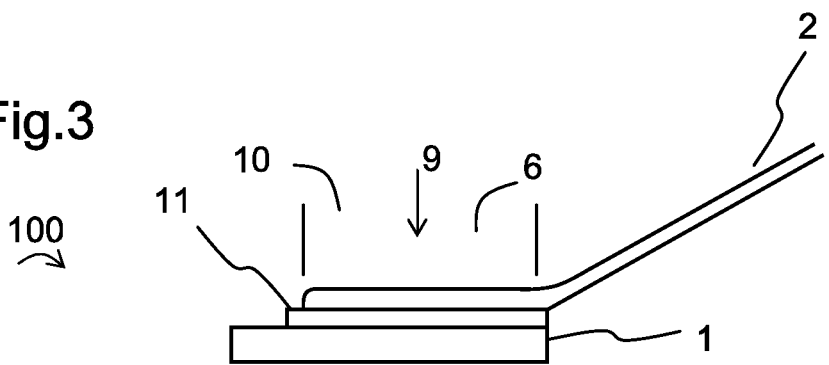
FIG. 3 shows a schematic side view of the apparatus.

FIG. 3 shows a side view of the apparatus 100. A contact region 10 is shown, in which, for producing the connection 3, a mechanical force indicated by the arrow 9 is applied for producing the connection 3 in the contact region 10 while the contact region has the force applied to it. Preferably, the connection 3 is formed in the contact region 10. When the mechanical force is applied, the force 9 preferably has a relative action between the main body 1 having the electrode 11 and the contact element 2. In this case, the main body can be fixed or secured, the force 9 being applied directly to the contact element, or vice versa. The mechanical force can be between 5 N and 10 N. The contact region 10 preferably overlaps the connecting region 6.

Furthermore, the contact region 10 has heat applied to it or is treated with heat. This can be carried out at temperatures of between 350° C. and 550° C., for example, at 450° C.

Preferably, exclusively the mechanical force and heat are applied to the contact region 10 for the purpose of forming the connection. The temperature of the application of heat and the mechanical force are preferably chosen in such a way that a diffusion of material (electrode material and material of the contact element) takes place, as a result of which the contact element is mechanically stably connected to the electrode.

The method mentioned makes it possible to keep the process temperature for producing the connection significantly below the melting point of the materials or metals involved.

The connection is preferably electrically of low resistance. The expression "of low resistance" can relate to electrical resistances of between one or a plurality of microohms ($\mu\Omega$) and one or a plurality of milliohms ($m\Omega$).

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An apparatus comprising:
a main body having an electrode; and
a contact element that is a wire comprising a connection region that is directly mechanically and electrically conductively connected to the electrode in order to electrically conductively and mechanically connect the main body and the contact element so that an electrical and mechanical connection between the electrode and the contact element is free of melting regions of materials of the electrode and of the contact element that are involved in the connection, wherein the connection is realized in a manner free of solder material, wherein the contact element is flattened in a region in which the connection is formed, and wherein the contact element has a larger width in the connection region than in a region other than the connection region;
wherein the connection has a plurality of local connection regions delimited from one another between the electrode and the contact element;
wherein the connection region forms a continuous region where the local connection regions are arranged;
wherein each local connection region of the plurality of local connection regions comprises a cohesive diffusion connection of the materials of the electrode and a material of the contact element; and
wherein the cohesive diffusion connection is formed by application of mechanical force and heat.

2. The apparatus according to claim 1, wherein the connection is realized in a manner free of any connection material.

3. The apparatus according to claim 1, wherein the connection is formed by a cohesive diffusion connection between a material of the electrode and a material of the contact element.

4. The apparatus according to claim 1, wherein a surface of the contact element that faces the electrode has a noble metal surface region in a connecting region in which the connection is formed.

5. An apparatus according to claim 1, wherein the main body comprises a ceramic body or a semiconductor body.

6. The apparatus according to claim 5, wherein the main body comprises an NTC ceramic.

7. The apparatus according to claim 1, further comprising an encapsulation around the connection, wherein the encapsulation is arranged in such a way that it protects the connection from external forces.

8. A method for producing an electrically conductive and mechanical connection between a main body having an electrode and a contact element, wherein the contact element is a wire, the method comprising:
directly mechanically contacting the electrode and the contact element in a contact region; and
applying a mechanical force and heat to the contact region, such that the electrically conductive and mechanical connection between the electrode and the contact element is formed in the contact region, wherein the contact element is flattened in a region in which the connection is formed, and wherein the contact element has a larger width in the connection region than in a region other than the connection region;
wherein the connection has a plurality of local connection regions delimited from one another between the electrode and the contact element;
wherein the connection region forms a continuous region where the local connection regions are arranged;
wherein each local connection region of the plurality of local connection regions comprises a cohesive diffusion connection of an electrode material and a material of the contact element; and
wherein the cohesive diffusion connection is formed by application of mechanical force and heat.

9. The method according to claim 8, wherein exclusively the mechanical force and heat are applied to the contact region to form the connection.

10. The method according to claim 8, wherein a temperature of the heat and the mechanical force are chosen so that a diffusion of material takes place, and wherein the contact element is mechanically stably and electrically conductively connected to the electrode.

11. The method according to claim 8, wherein a temperature of the heat is below a melting point of an electrode material.

12. The method according to claim 8, wherein a temperature of the heat is below a melting point of a material of the contact element that is offered for the connection.

13. The method according to claim 8, wherein the mechanical force is between 5 N and 10 N and the heat is applied at a temperature of between 350° C. and 550° C.

14. The method according to claim 8, further comprising encapsulating the connection after the connection is formed.

15. The method according to claim 14, wherein the connection is encapsulated with a shaped body for mechanically stabilizing the contact element.

* * * * *